United States Patent
Kawaguchi

(10) Patent No.: US 12,092,662 B2
(45) Date of Patent: Sep. 17, 2024

(54) CLAMP-TYPE AC VOLTAGE PROBE

(71) Applicant: NIDEC READ CORPORATION, Kyoto (JP)

(72) Inventor: Masahiro Kawaguchi, Kyoto (JP)

(73) Assignee: NIDEC READ CORPORATION, Kyoto (JP)

( * ) Notice: Subject to any disclaimer, the term of this patent is extended or adjusted under 35 U.S.C. 154(b) by 192 days.

(21) Appl. No.: 17/910,362

(22) PCT Filed: Feb. 22, 2021

(86) PCT No.: PCT/JP2021/006518
§ 371 (c)(1),
(2) Date: Sep. 9, 2022

(87) PCT Pub. No.: WO2021/182082
PCT Pub. Date: Sep. 16, 2021

(65) Prior Publication Data
US 2023/0127522 A1 Apr. 27, 2023

(30) Foreign Application Priority Data
Mar. 13, 2020 (JP) ................. 2020-044778

(51) Int. Cl.
*G01R 15/16* (2006.01)
*G01R 1/04* (2006.01)
(Continued)

(52) U.S. Cl.
CPC ............... *G01R 15/16* (2013.01); *G01R 1/04* (2013.01); *G01R 1/06788* (2013.01); *G01R 19/0084* (2013.01)

(58) Field of Classification Search
CPC ................. G01R 1/07307; G01R 1/06711; G01Q 70/16; G01N 2001/2285
See application file for complete search history.

(56) References Cited

U.S. PATENT DOCUMENTS

| 4,507,618 A | 3/1985 | Nelson | |
| 6,646,562 B1 * | 11/2003 | Chang | G01R 1/22 340/657 |

(Continued)

FOREIGN PATENT DOCUMENTS

| JP | H04276561 A | 10/1992 |
| JP | 2002090394 A | 3/2002 |

(Continued)

*Primary Examiner* — Tung X Nguyen
(74) *Attorney, Agent, or Firm* — Viering, Jentschura & PARTNER MBB

(57) ABSTRACT

A clamp-type AC voltage probe includes: a clamp portion that clamps a cable to be measured; an electrode disposed to be opposed to the cable clamped by the clamp portion; a parallel circuit in which a capacitor and a resistance are connected in parallel, and one end of which is connected to the electrode; a resistance one end of which is connected to the other end of the parallel circuit and the other end of which is connected to a circuit ground; a capacitor one end of which is connected to the other end of the parallel circuit and the other end of which is connected to the circuit ground; and an amplifier an input terminal of which is connected to the one end or the other end of the parallel circuit, and that amplifies and outputs a signal input into the input terminal.

20 Claims, 3 Drawing Sheets

(51) Int. Cl.
*G01R 1/067* (2006.01)
*G01R 19/00* (2006.01)

(56) References Cited

U.S. PATENT DOCUMENTS

| | | | |
|---|---|---|---|
| 11,079,407 B2 | 8/2021 | Dandy | |
| 2013/0208761 A1* | 8/2013 | Mavrides | G01J 5/0846 374/121 |
| 2020/0041549 A1 | 2/2020 | Giovannoni | |

FOREIGN PATENT DOCUMENTS

| | | |
|---|---|---|
| JP | 2002271159 A | 9/2002 |
| JP | 2010025653 A | 2/2010 |
| JP | 2010025918 A | 2/2010 |
| JP | 2013120098 A | 6/2013 |
| JP | 2017032287 A | 2/2017 |

\* cited by examiner

CLAMP-TYPE AC VOLTAGE PROBE

CROSS-REFERENCE TO RELATED APPLICATIONS

This is a U.S. National Stage Application, filed under 35 U.S.C. § 371, of International Application No. PCT/JP2021/006518, filed on Feb. 22, 2021, and claims priority under 35 U.S.C. § 119(a) and 35 U.S.C. § 365(b) from Japanese Patent Application No. 2020-044778, filed on Mar. 13, 2020; the disclosures of which are incorporated herein by reference.

FIELD

Various embodiments of the present disclosure relate to a clamp-type AC voltage probe that clamps a cable to be measured.

BACKGROUND

A conventional voltage detection device that detects a detection target AC voltage by generating a reference voltage so that a potential difference between the detection target AC voltage and the reference voltage decreases, that is, by generating the reference voltage having the same voltage as the detection target AC voltage has been known.

However, according to the voltage detection device described above, since it is necessary to generate the reference voltage having the same voltage as the detection target AC voltage, for example, when the detection target AC voltage is a high voltage of several hundred to 1000 volts, a circuit that generates such a high voltage needs to be provided. The circuit that generates such a high voltage is expensive, and it is not easy to reproduce an AC waveform of the detected high voltage.

SUMMARY

An exemplary clamp-type AC voltage probe according to an example of the present disclosure includes: a clamp portion that clamps a cable to be measured; an electrode disposed to be opposed to the cable clamped by the clamp portion; a parallel circuit in which a first capacitor and a first resistance are connected in parallel, and one end of which is connected to the electrode; a second resistance one end of which is connected to the other end of the parallel circuit and the other end of which is connected to a circuit ground; a second capacitor one end of which is connected to the other end of the parallel circuit and the other end of which is connected to a circuit ground; and an amplifier an input terminal of which is connected to the one end or the other end of the parallel circuit, and that amplifies and outputs a signal input into the input terminal.

The above and other elements, features, steps, characteristics and advantages of the present disclosure will become more apparent from the following detailed description of embodiments with reference to the attached drawings.

DETAILED DESCRIPTION

Figure 1:
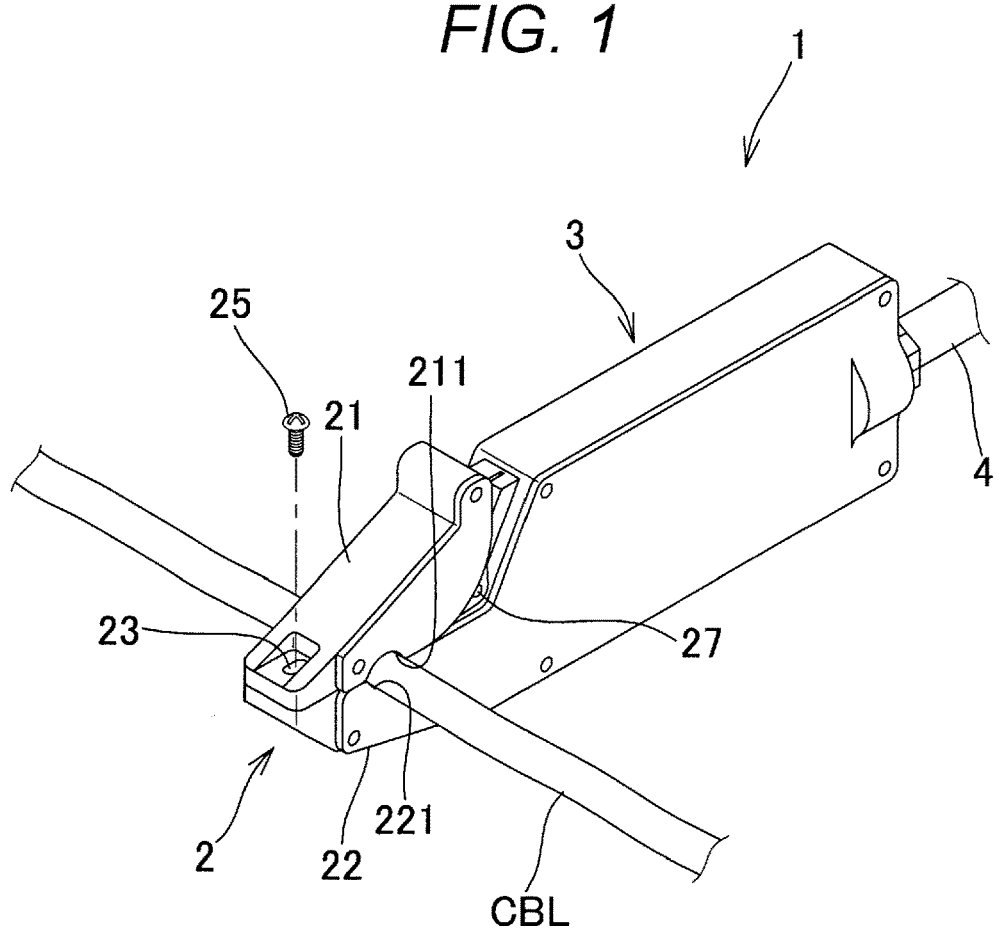
FIG. 1 is a perspective view illustrating an example of a configuration of a clamp-type AC voltage probe according to an exemplary embodiment of the present disclosure.

Embodiments according to the present disclosure will be described with reference to the drawings hereinafter. It is to be noted that components with the same reference numerals in the respective drawings will be the same components and descriptions thereof will be omitted.

A clamp-type AC voltage probe 1 illustrated in FIG. 1 generally includes a clamp portion 2 that clamps a cable CBL to be measured, and a housing 3 connected to the clamp portion 2 and having a substantial box-shape. The housing 3 is connected to a measuring apparatus such as an oscilloscope or a data logger via a coaxial cable 4.

The clamp portion 2 includes a pair of clamp arms 21, 22. A base end portion of the clamp arm 21 is pivotally supported by a shaft body 27 attached to the housing 3. The clamp arm 21 is swingable around the shaft body 27. Holding grooves 211, 221 into which the cable CBL is fitted are formed on facing surfaces of the clamp arms 21, 22.

The clamp arm 21 is biased toward the clamp arm 22 by a torsion spring not illustrated. The cable CBL is configured to be clamped between the clamp arm 21 and the clamp arm 22 by a biasing force of the torsion spring.

Figure 2:
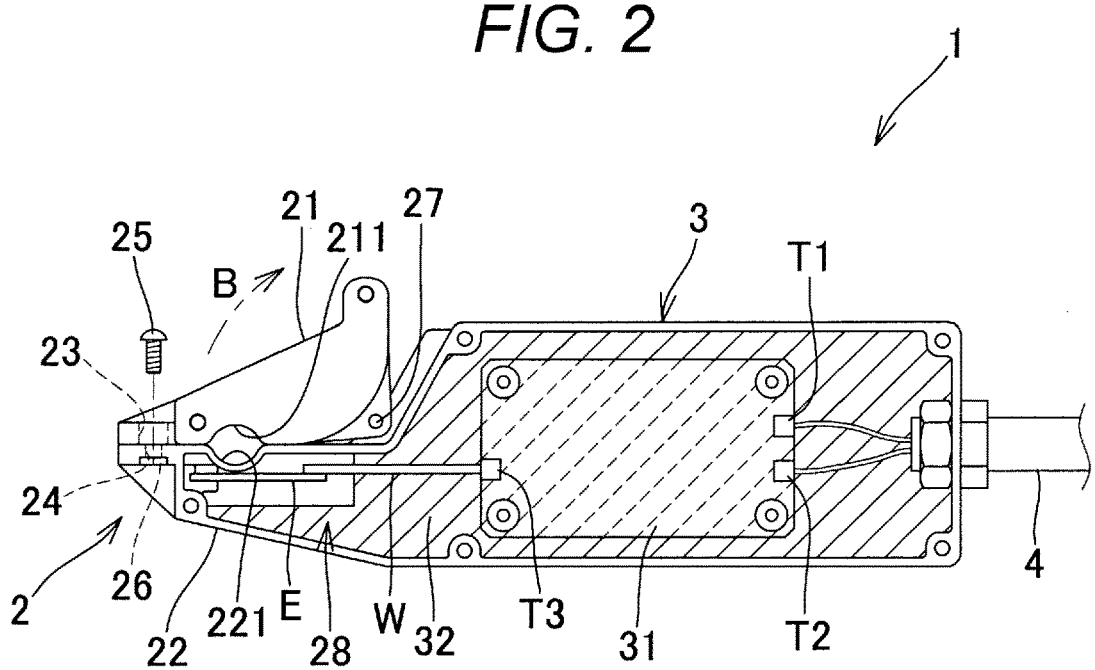
FIG. 2 is a front view illustrating the inside by seeing through a front wall of a clamp arm and a housing shown in FIG. 1.

Referring to FIG. 2, the clamp arm 22 is fixedly connected to the housing 3. It is to be noted that the clamp arm 22 may be swingable similarly to the clamp arm 21.

The clamp arms 21, 22 and the housing 3 are made of an insulating material, for example, a resin material.

An accommodation space 28 is provided inside the clamp arm 22. The accommodation space 28 communicates with an internal space of the housing 3. In the accommodation space 28, an electrode E having a substantially plate shape is disposed. The electrode E may be formed as a conductor pattern on a printed wiring board, for example, or may be a metal plate. The electrode E is disposed to be opposed to or in contact with an inner wall surface of the holding groove 221 of the clamp arm 22. As a result, the electrode E is arranged to be opposed to the cable CBL clamped by the clamp portion 2 via a wall of the holding groove 221 made of the insulating material.

The housing 3 accommodates a circuit board 31. A terminal T3 of the circuit board 31 and the electrode E are connected via wiring W.

A conductive layer 32 having conductivity indicated by hatching is formed on an inner wall surface of the accommodation space 28 of the clamp arm 22 and the housing 3 except for at least a portion located between the cable CBL clamped by the clamp portion 2 and the electrode E.

The conductive layer 32 may be, for example, metal foil such as aluminum foil, may be applied with a conductive paint, may be a plating layer, or may be a metal plate. In the example illustrated in FIG. 2, the conductive layer 32 is not formed on the wall of the holding groove 221 located between the cable CBL clamped by the clamp portion 2 and the electrode E and a peripheral portion of the electrode E.

As a result, an outer wall surface of the clamp-type AC voltage probe 1 is made to be insulative, and the inner wall surface of the housing 3 and the inner wall surface of the clamp arm 22 excluding at least the portion located between the cable CBL clamped by the clamp portion 2 and the electrode E are made to be conductive.

Since the outer wall surface of the clamp-type AC voltage probe 1 is insulative, for example, even when a conductor portion of the cable CBL is exposed, a risk that an electric current flows from the cable CBL to the electrode E and the circuit board 31 and that the clamp-type AC voltage probe 1 is damaged is reduced. In addition, safety of a user operating the clamp-type AC voltage probe 1 is improved.

In addition, electromagnetic noise from an external environment is capable of being reduced by equipment of the conductive layer 32.

It is to be noted that the electrode E is not necessarily limited to the example in which the electrode E is disposed inside the clamp portion 2 and is disposed so as to be opposed to the cable CBL via the insulating material. For example, the electrode E may be disposed to be exposed to the holding groove 221 and may be disposed to be opposed to the cable CBL in a state of being in contact with the cable CBL.

In the vicinities of tips of the clamp arms 21, 22, screw holes 23, 24 of loose holes penetrating the clamp arms 21, 22 in a state in which the clamp arms 21, 22 are closed are formed. A nut 26 is attached to the screw hole 24 of the clamp arm 22 on an opposite side to the clamp arm 21. As a result, a screw 25 is inserted into the screw hole 24 from the screw hole 23 side and the screw 25 and the nut 26 are tightened, so that the cable CBL is capable of being firmly clamped by the clamp arms 21, 22.

As described later, the clamp-type AC voltage probe 1 detects an AC voltage of the cable CBL via capacitance Cx generated by arranging a conductor line of the cable CBL and the electrode E so as to be opposed to each other. The capacitance Cx is in inverse proportion to a facing distance d between the conductor line of the cable CBL and the electrode E. Thus, the shorter the facing distance d becomes, the more the capacitance Cx becomes, and detection of the AC voltage becomes easier. In addition, when the facing distance d varies, a voltage level obtained via the capacitance Cx fluctuates.

On the other hand, in the clamp arms 21, 22, there is a risk that a clamping force of the cable CBL is insufficient only by the biasing force of the torsion spring not illustrated, a gap is generated between the cable CBL and the holding groove 221, the facing distance d increases, and the capacitance Cx decreases. In addition, there is a risk that the cable CBL swings, so that the facing distance d varies, and the capacitance Cx fluctuates.

However, since the clamp-type AC voltage probe 1 is able to firmly clamp the cable CBL by tightening the clamp arms 21, 22 with the screw 25, it is possible to reduce the risk of the generating of the decrease in the capacitance Cx due to the increase in the facing distance d and the variation in the capacitance Cx due to the swing of the cable CBL.

It is to be noted that the nut 26 may be provided on the screw hole 23 side, and the screw 25 may be inserted from the screw hole 24. In addition, a thread groove may be formed in the screw hole 23 or the screw hole 24 without providing the nut 26.

Figure 3:
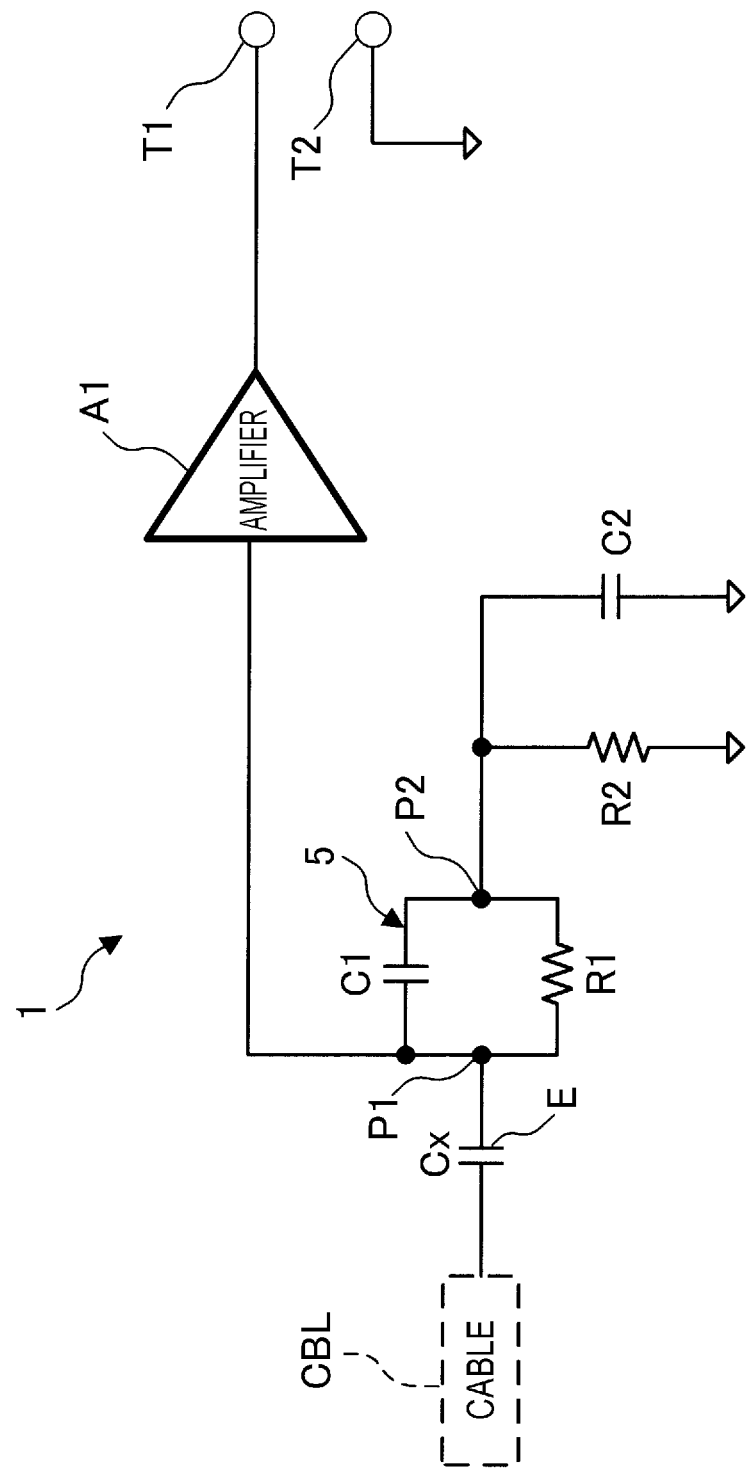
FIG. 3 is a circuit diagram illustrating an example of an electrical configuration of the clamp-type AC voltage probe shown in FIG. 1.

The clamp-type AC voltage probe 1 illustrated in FIG. 3 includes the electrode E, a parallel circuit 5, a resistance R2 (second resistance), a capacitor C2 (second capacitor), an amplifier A1, and terminals T1, T2. The parallel circuit 5 is a parallel circuit of a capacitor C1 (first capacitor) and a resistance R1 (first resistance). The parallel circuit 5, the resistance R2, the capacitor C2, the amplifier A1, and the terminals T1, T2 are formed on the circuit board 31.

In FIG. 3, the capacitance formed by the cable CBL and the electrode E opposed to each other is represented by the capacitance Cx.

The electrode E is connected to one end P1 of the parallel circuit 5 via the wiring W and the terminal T3 illustrated in FIG. 2. The other end P2 of the parallel circuit 5 is connected to a circuit ground via the capacitor C2. In addition, the other end P2 of the parallel circuit 5 is connected to the circuit ground via the resistance R2. The circuit ground is connected to the conductive layer 32.

The one end P1 of the parallel circuit 5 is connected to an input terminal of the amplifier A1. An output terminal of the amplifier A1 is connected to the terminal T1. The terminal T2 is connected to the circuit ground.

The terminal T1 is connected to a core wire of the coaxial cable 4, and the terminal T2 is connected to a shielding wire of the coaxial cable 4. As a result, an output signal of the amplifier A1 is output to the measuring apparatus such as the oscilloscope or the data logger via the coaxial cable 4. It is to be noted that the output signal of the amplifier A1 is not limited to the example of being output via the coaxial cable, and may be a twisted pair cable, a multicore cable, or the like. In addition, an output signal line of the amplifier A1 and a power supply line for operation of the amplifier A1 or the like may be included in one cable. From a point of view of reducing an influence of noise, a cable can be provided for supplying a power supply for operation such as the amplifier A1 besides the cable for the output signal of the amplifier A1.

Although the cable CBL is not particularly limited, for example, a power cable for driving a motor of an electric vehicle is assumed. In the case of the power cable for driving the motor of the electric vehicle, an AC voltage having a rectangular wave periodic waveform by pulse width modulation (PWM) output from an inverter is a measurement object. In the above case, an assumed voltage is AC 200 V to 1000 V, and a measured waveform is a pulse corresponding to a frequency of 1 kHz to 1 MHz.

The AC voltage of the cable CBL is applied to the one end P1 of the parallel circuit 5 via the capacitance Cx.

For example, in the case of the rectangular wave periodic waveform by PWM, since high frequency components are included in a rise and a fall of the rectangular wave, it is necessary to detect both low frequency components corresponding to a period of the rectangular wave and the high frequency components corresponding to the rise and the fall of the rectangular wave in order to accurately measure a voltage waveform of the cable CBL.

Thus, according to the clamp-type AC voltage probe 1, a series circuit of the resistance R1 and the capacitor C2 is configured. The series circuit of the resistance R1 and the capacitor C2 is a so-called integration circuit, and functions as a low-pass filter that passes the low frequency components.

Since a voltage between terminals of the capacitor C2 and a voltage between the terminals of the resistance R1 are added and applied to the input terminal of the amplifier A1, according to the series circuit of the resistance R1 and the capacitor C2, the low frequency components corresponding to the period of the rectangular wave are capable of being input to the amplifier A1.

Further, according to the clamp-type AC voltage probe 1, a series circuit of the capacitor C1 and the resistance R2 is configured. The series circuit of the capacitor C1 and the resistance R2 is a so-called differential circuit, and functions as a high-pass filter that passes the high frequency components.

Since a voltage between terminals of the resistance R2 and a voltage between terminals of the capacitor C1 are added and applied to the input terminal of the amplifier A1, according to the series circuit of the capacitor C1 and the resistance R2, the high frequency components corresponding to the rise and the fall of the rectangular wave are capable of being input to the amplifier A1.

That is, both the low frequency components corresponding to the period of the rectangular wave and the high frequency components corresponding to the rise and the fall of the rectangular wave are superimposed and input to the input terminal of the amplifier A1. Consequently, the AC voltage waveform detected from the cable CBL is capable of being accurately amplified by the amplifier A1 and being output to the measuring apparatus.

In addition, a resistance value $R_1$ of the resistance R1 is made much larger than impedance of the capacitor C1. Specifically, for example, the resistance value $R_1$ may be set to 1 MΩ to 1 GΩ. For example, assuming that the assumed frequency f is 1 kHz to 1 MHz and the capacitor C1 is 1 nF, the impedance |Z| of the capacitor C1 with respect to 1 kHz is $1/(2\pi \times 10^3 \times 10^{-9})$=159 kΩ, and the impedance |Z| of the capacitor C1 with respect to 1 MHz is $1/(2\pi \times 10^6 \times 10^{-9})$=159Ω.

As a result, the resistance value $R_1$ is 1 MΩ/159 kΩ=6.3 times or more larger than the impedance |Z| of the capacitor C1 when the frequency f is 1 kHz, and 1 MΩ/159 Ω=6300 times or more larger than the impedance |Z| of the capacitor C1 when the frequency f is 1 MHz. Thus, most of an AC current detected from the cable CBL flows through a series circuit of the capacitance Cx and the capacitors C1, C2.

As a result, since a current flowing through the resistance R1 may be substantially ignored, a cable voltage Vin of the cable CBL is divided by the series circuit of the capacitance Cx and the capacitors C1, C2, and an input voltage Va input to the amplifier A1 is capable of being approximated by the following Formula (1).

$$Va = Vin \times (CxC_2 + CxC_1)/(C_1C_2 + CxC_2 + CxC_1) \tag{1}$$

However, note that capacitance of the capacitor C1 is $C_1$, and capacitance of the capacitor C2 is $C_2$.

As described above, according to the clamp-type AC voltage probe 1, the cable voltage Vin is divided, and the input voltage Va with a reduced voltage is input to the amplifier A1. Consequently, it is easy to measure the AC voltage of a high voltage without providing a circuit that generates the high voltage as conventionally known.

For example, the capacitance Cx may be set to 0.1 to 10 pF, the capacitance $C_1$ may be set to 0.1 to 10 nF, and the capacitance $C_2$ may be set to 1 to 100 nF. When Cx=0.1 pF, $C_1$=0.1 nF, and $C_2$=1 nF, Va=Vin×0.001 is obtained according to Formula (1). When Cx=10 pF, $C_1$=10 nF, and $C_2$=100 nF, Va=Vin×0.001 is obtained according to Formula (1).

That is, the input voltage Va formed by reducing the cable voltage Vin to 1/1000 is capable of being input to the amplifier A1. In this case, even if the cable voltage Vin is 1 kV, since the input voltage Va input to the amplifier A1 is 1 V, it is easy to measure the cable voltage Vin of the high voltage.

The amplifier A1 is a so-called amplifier circuit that amplifies and outputs an input signal. The amplifier A1 can be an element of which input impedance is high impedance, and for example, an amplifier configured using a field effect transistor (FET) such as a junction FET or a metal-oxide-semiconductor FET (MOSFET) may be suitably used.

As described above, the AC current detected by the electrode E from the cable CBL flows through the series circuit of the capacitance Cx and the capacitors C1, C2, so that the cable voltage Vin is divided and the input voltage Va is input to the amplifier A1. However, when the input impedance of the amplifier A1 is small, the detected AC current flows into the amplifier A1, and the current flowing through the series circuit of the capacitance Cx and the capacitors C1, C2 decreases, so that the input voltage Va decreases. Thus, there is a risk that detection accuracy of the cable voltage Vin is deteriorated.

However, by setting the input impedance of the amplifier A1 to the high impedance, the current flowing into the input terminal of the amplifier A1 is capable of being reduced. As a result, it is possible to reduce the risk that the detection accuracy of the cable voltage Vin decreases.

The output signal of the amplifier A1 is output to the measuring apparatus via the terminal T1 and the coaxial cable 4. As a result, the AC voltage waveform of the cable CBL is capable of being observed by the measuring apparatus.

Figure 4:
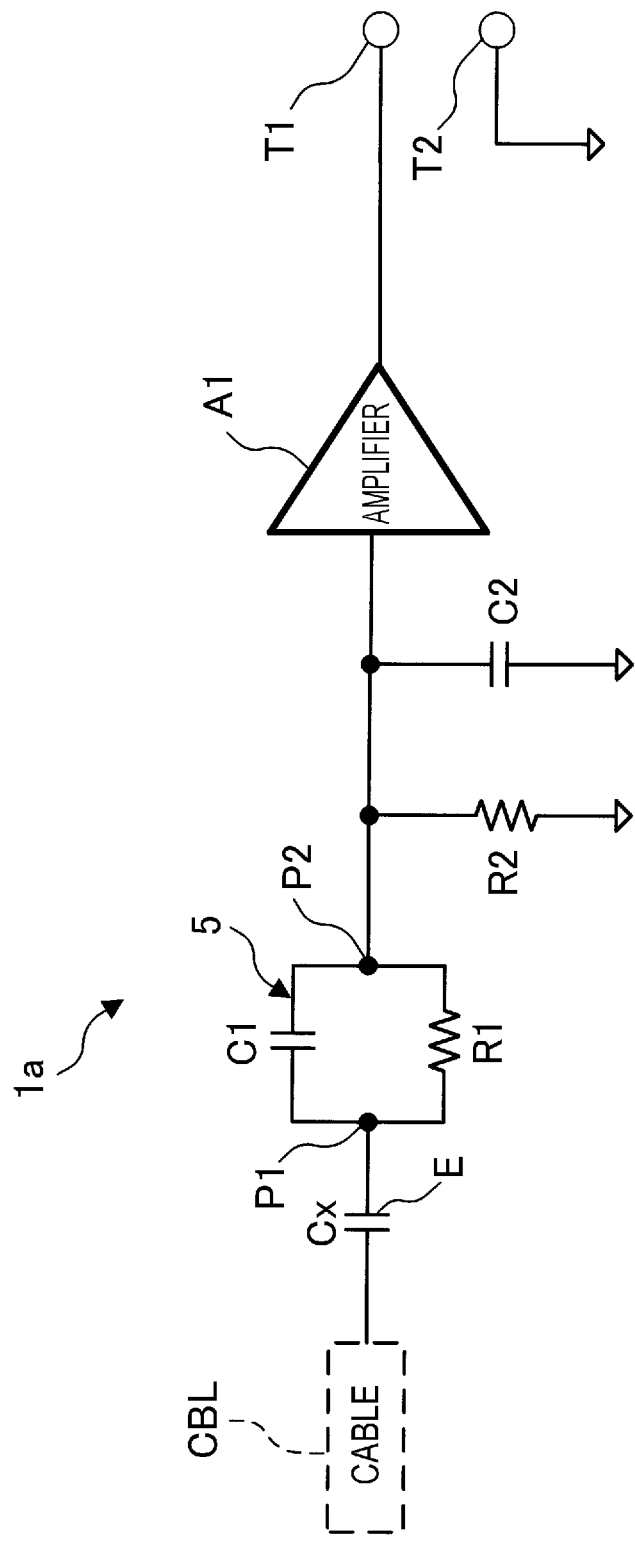
FIG. 4 is a circuit diagram illustrating another example of the electrical configuration of the clamp-type AC voltage probe shown in FIG. 3.

It is to be noted that, as illustrated in FIG. 4, the input terminal of the amplifier A1 may be connected to the other end P2 instead of the one end P1. However, there is a case in which it is desired to adjust filter characteristics of the low-pass filter composed of the resistance R1 and the capacitor C2 and the high-pass filter composed of the capacitor C1 and the resistance R2 depending on the frequency and the waveform of the signal to be detected. When circuit constants of the capacitors C1, C2 are changed with such adjustment of the filter characteristics and a voltage division ratio in the series circuit of the capacitance Cx and the capacitors C1, C2 changes, a detection level input to the amplifier A1 changes in the case in which the input terminal of the amplifier A1 is connected to the other end P2.

On the other hand, when the input terminal of the amplifier A1 is connected to the one end P1, by adjusting the pieces of capacitance of the capacitors C1, C2 within a range in which series impedance of the capacitors C1, C2 does not change, it is possible to adjust the filter characteristics while suppressing the change in the detection level input to the amplifier A1. Consequently, the input terminal of the amplifier A1 may be connected to the other end P2, nevertheless, it can be connected to the one end P1.

That is, the clamp-type AC voltage probe according to an example of the present disclosure includes: the clamp portion that clamps the cable to be measured; the electrode disposed to be opposed to the cable clamped by the clamp portion; the parallel circuit in which the first capacitor and the first resistance are connected in parallel, and the one end of which is connected to the electrode; the second resistance one end of which is connected to the other end of the parallel circuit and the other end of which is connected to the circuit ground; the second capacitor one end of which is connected to the other end of the parallel circuit and the other end of which is connected to the circuit ground; and the amplifier the input terminal of which is connected to the one end or the other end of the parallel circuit, and that amplifies and outputs the signal input into the input terminal.

According to this configuration, the core wire of the cable and the electrode are arranged to be opposed to each other, and the electrode is electrostatically coupled to the core wire of the cable. As a result, the AC voltage of the cable is applied to the one end of the parallel circuit via the capacitance generated between the core wire of the cable and the electrode. In addition, the first resistance and the second capacitor are connected in series to form the low-pass filter, and the first capacitor and the second resistance are connected in series to form the high-pass filter. As a result, a fundamental frequency of the AC voltage to be measured is acquired by the low-pass filter, and the high frequency components included in the waveform such as the rise and fall of the AC voltage are acquired by the high-pass filter, so that the waveform to be measured is easily detected with high accuracy. Furthermore, since the cable and the electrode are electrostatically coupled, a direct current from the cable is cut off, and the current obtained from the electrode becomes the alternating current. As a result, the voltage input to the amplifier is dominated by the divided voltage depending on the capacitance between the cable and the electrode, the first capacitor, and the second capacitor. Thus, even if the voltage of the cable is the high voltage, the divided and lowered voltage is input to the amplifier. Consequently, even if the measurement object is the high voltage, the AC voltage is capable of being detected without providing the circuit that generates the high voltage as conventionally known, and thus the AC voltage of the high voltage is easily detected by using this clamp-type AC voltage probe.

In addition, the input terminal of the amplifier can be connected to the one end of the parallel circuit.

According to this configuration, the voltage division ratio of the voltage input to the amplifier is determined by the series impedance of the first capacitor and the second capacitor. On the other hand, when the input terminal of the amplifier is connected to the other end of the parallel circuit, the voltage division ratio of the voltage input to the amplifier is determined by impedance of the second capacitor. Thus, when the capacitance of the second capacitor is changed to adjust the characteristics of the low-pass filter, a signal level input to the amplifier also changes. On the other hand, according to the above configuration, since the voltage division ratio of the voltage input to the amplifier is determined by the series impedance of the first capacitor and the second capacitor, it is easy to adjust the capacitance of the second capacitor while suppressing the change in the signal level input to the amplifier by changing the capacitance of the second capacitor within a range in which the series impedance of the first and second capacitors is not changed.

In addition, the resistance value of the first resistance can be larger than the impedance of the first capacitor.

According to this configuration, in the parallel circuit of the first capacitor and the first resistance, a larger amount of current flows through the first capacitor than through the first resistance. As a result, a voltage division accuracy depending on the capacitance between the cable and the electrode, the first capacitor, and the second capacitor is improved.

In addition, the input terminal of the amplifier can have the high impedance.

According to this configuration, since the current flowing from the electrode to the input terminal of the amplifier is reduced, the voltage division accuracy depending on the capacitance between the cable and the electrode, the first capacitor, and the second capacitor is improved.

In addition, the amplifier can be configured using the FET.

Since input impedance of the FET is the high impedance, the FET is suitable as the above-described amplifier.

In addition, the clamp portion can be made of the insulating material, and the electrode can be disposed inside the clamp portion and disposed so as to be opposed to the cable via the insulating material.

According to this configuration, even when the core wire of the cable comes into contact with the clamp portion, the voltage of the cable is not directly applied to the electrode, so that safety of the clamp-type AC voltage probe is improved.

In addition, the housing can be connected to the clamp portion and accommodating the parallel circuit, the second resistance, the second capacitor, and the amplifier can be further provided, and the housing can have the outer wall surface that is insulative and the inner wall surface that is conductive, and the circuit ground can be connected to the conductive inner wall surface.

According to this configuration, the electromagnetic noise from the external environment is capable of being reduced by the conductive inner wall surface while improving the safety by making the outer wall surface of the housing touched by the user insulative.

In addition, the clamp portion can have the accommodation space accommodating the electrode, the outer wall surface of the clamp portion can be insulative, the inner wall surface of the accommodation space can be conductive except for at least the portion located between the electrode and the cable, and the circuit ground can be connected to the conductive inner wall surface of the accommodation space.

According to this configuration, the electromagnetic noise from the external environment is capable of being reduced by the conductive portion of the inner wall surface while improving the safety by making the outer wall surface of the clamp portion touched by the user insulative.

In addition, the clamp portion can clamp the cable by the pair of clamp arms, at least one base end portion of the pair of clamp arms is pivotally supported by the shaft body, the at least one clamp arm can be swingable around the shaft body, and the screw holes can be capable of receiving the screw for fastening the pair of clamp arms formed in the vicinities of the tips of the pair of clamp arms.

According to this configuration, since the screw is able to fasten the pair of clamp arms, the pair of clamp arms are able to firmly clamp the cable. Thus, the gap is hardly generated between the cable and the clamp arm, so that the capacitance between the cable and the electrode is stabilized. As a result, the clamp-type AC voltage probe easily detects the cable voltage.

Features of the above-described embodiments and the modifications thereof may be combined appropriately as long as no conflict arises.

While certain embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A clamp-type AC voltage probe comprising:
   a clamp portion that clamps a cable to be measured;
   an electrode disposed to be opposed to the cable clamped by the clamp portion;
   a parallel circuit in which a first capacitor and a first resistance are connected in parallel, and one end of which is connected to the electrode;
   a second resistance one end of which is connected to the other end of the parallel circuit and the other end of which is connected to a circuit ground;
   a second capacitor one end of which is connected to the other end of the parallel circuit and the other end of which is connected to a circuit ground; and
   an amplifier an input terminal of which is connected to the one end or the other end of the parallel circuit, and that amplifies and outputs a signal input into the input terminal.

2. The clamp-type AC voltage probe according to claim 1, wherein the input terminal of the amplifier is connected to the one end of the parallel circuit.

3. The clamp-type AC voltage probe according to claim 1, wherein the first resistance has a resistance value that is larger than impedance of the first capacitor.

4. The clamp-type AC voltage probe according to claim 1, wherein the input terminal of the amplifier has high impedance.

5. The clamp-type AC voltage probe according to claim 4, wherein the amplifier has an FET.

6. The clamp-type AC voltage probe according to claim 1, wherein
the clamp portion is made of an insulating material, and
the electrode is disposed inside the clamp portion and is disposed to be opposed to the cable via the insulating material.

7. The clamp-type AC voltage probe according to claim 1, further comprising
a housing connected to the clamp portion and accommodating the parallel circuit, the second resistance, the second capacitor, and the amplifier,
wherein the housing includes an outer wall surface that is insulative and an inner wall surface that is conductive, and
the circuit ground is connected to the inner wall surface that is conductive.

8. The clamp-type AC voltage probe according to claim 7, wherein
the clamp portion includes an accommodation space accommodating the electrode,
the clamp portion includes an outer wall surface that is insulative,
the accommodation space has an inner wall surface that is conductive except for at least a portion located between the electrode and the cable, and
the circuit ground is connected to the inner wall surface of the accommodation space that is conductive.

9. The clamp-type AC voltage probe according to claim 1, wherein
the clamp portion clamps the cable by a pair of clamp arms,
at least one base end portion of the pair of clamp arms is pivotally supported by a shaft body,
the at least one clamp arm is swingable around the shaft body, and
the pair of clamp arms have screw holes capable of receiving a screw for fastening the pair of clamp arms, and the screw holes are formed in the vicinities of tips of the pair of clamp arms.

10. The clamp-type AC voltage probe according to claim 2, wherein the first resistance has a resistance value that is larger than impedance of the first capacitor.

11. The clamp-type AC voltage probe according to claim 2, wherein the input terminal of the amplifier has high impedance.

12. The clamp-type AC voltage probe according to claim 3, wherein the input terminal of the amplifier has high impedance.

13. The clamp-type AC voltage probe according to claim 2, wherein
the clamp portion is made of an insulating material, and
the electrode is disposed inside the clamp portion and is disposed to be opposed to the cable via the insulating material.

14. The clamp-type AC voltage probe according to claim 3, wherein
the clamp portion is made of an insulating material, and
the electrode is disposed inside the clamp portion and is disposed to be opposed to the cable via the insulating material.

15. The clamp-type AC voltage probe according to claim 4, wherein
the clamp portion is made of an insulating material, and
the electrode is disposed inside the clamp portion and is disposed to be opposed to the cable via the insulating material.

16. The clamp-type AC voltage probe according to claim 5, wherein
the clamp portion is made of an insulating material, and
the electrode is disposed inside the clamp portion and is disposed to be opposed to the cable via the insulating material.

17. The clamp-type AC voltage probe according to claim 2, further comprising
a housing connected to the clamp portion and accommodating the parallel circuit, the second resistance, the second capacitor, and the amplifier,
wherein the housing includes an outer wall surface that is insulative and an inner wall surface that is conductive, and
the circuit ground is connected to the inner wall surface that is conductive.

18. The clamp-type AC voltage probe according to claim 3, further comprising
a housing connected to the clamp portion and accommodating the parallel circuit, the second resistance, the second capacitor, and the amplifier,
wherein the housing includes an outer wall surface that is insulative and an inner wall surface that is conductive, and
the circuit ground is connected to the inner wall surface that is conductive.

19. The clamp-type AC voltage probe according to claim 4, further comprising
a housing connected to the clamp portion and accommodating the parallel circuit, the second resistance, the second capacitor, and the amplifier,
wherein the housing includes an outer wall surface that is insulative and an inner wall surface that is conductive, and
the circuit ground is connected to the inner wall surface that is conductive.

20. The clamp-type AC voltage probe according to claim 5, further comprising
a housing connected to the clamp portion and accommodating the parallel circuit, the second resistance, the second capacitor, and the amplifier,
wherein the housing includes an outer wall surface that is insulative and an inner wall surface that is conductive, and
the circuit ground is connected to the inner wall surface that is conductive.

* * * * *